(12) United States Patent
Nagano

(10) Patent No.: US 7,640,138 B2
(45) Date of Patent: *Dec. 29, 2009

(54) INTERCONNECTION PATTERN INSPECTION METHOD, MANUFACTURING METHOD OF SEMICONDUCTOR DEVICE AND INSPECTION APPARATUS

(75) Inventor: Osamu Nagano, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/387,822

(22) Filed: Mar. 24, 2006

(65) Prior Publication Data
US 2006/0167650 A1    Jul. 27, 2006

Related U.S. Application Data

(62) Division of application No. 10/754,609, filed on Jan. 12, 2004, now Pat. No. 7,047,154.

(30) Foreign Application Priority Data
Jan. 14, 2003    (JP) .................................. 2003-5883

(51) Int. Cl.
G01N 37/00    (2006.01)
G01B 5/02    (2006.01)
G01B 7/02    (2006.01)
G01B 11/02    (2006.01)
G01B 13/02    (2006.01)

(52) U.S. Cl. ........................................ 702/170; 702/81

(58) Field of Classification Search .................... 702/38, 702/81, 84, 97, 158, 159, 170, 182; 700/108–110, 700/117, 121
See application file for complete search history.

(56) References Cited

U.S. PATENT DOCUMENTS 5,416,411 A * 5/1995 Elsmore ...................... 324/230

(Continued)

FOREIGN PATENT DOCUMENTS

JP    2559512    9/1996

(Continued)

OTHER PUBLICATIONS

Brochure entitled "Non-contact Metal Thickness Measurement System MESEC Series," ULVAC Solutions Catalog, Dec. 2002, 5 pages.

*Primary Examiner*—Michael P Nghiem
(74) *Attorney, Agent, or Firm*—Finnegan, Henderson, Farabow, Garrett & Dunner, L.L.P.

(57) ABSTRACT

A method of inspecting an interconnection pattern formed by depositing a metal onto a substrate having an interconnection pattern groove formed on a surface thereof includes: selectively measuring a thickness of a part above the substrate of a metal film formed on the substrate, the part above the substrate being a part constituted of the metal deposited upward from substantially the same surface as the surface of the substrate on which an interconnection pattern groove is formed; and evaluating how successfully the interconnection pattern groove is filled with the metal on the basis of a film thickness value obtained by the selective measurement.

14 Claims, 8 Drawing Sheets

U.S. PATENT DOCUMENTS

| | | | |
|---|---|---|---|
| 6,225,227 B1 * | 5/2001 | Aizawa | 438/694 |
| 6,563,308 B2 | 5/2003 | Nagano et al. | |
| 6,649,516 B2 | 11/2003 | Asakawa et al. | |
| 6,651,325 B2 * | 11/2003 | Lee et al. | 29/846 |
| 6,906,423 B1 * | 6/2005 | Asakawa et al. | 257/775 |
| 7,047,154 B2 * | 5/2006 | Nagano | 702/170 |
| 2004/0138838 A1 * | 7/2004 | Scheiner et al. | 702/64 |

FOREIGN PATENT DOCUMENTS

| | | |
|---|---|---|
| JP | 2570130 | 10/1996 |
| JP | 10-154737 | 6/1998 |
| JP | 2001-156138 | 6/2001 |
| JP | 2001-313322 | 11/2001 |
| JP | 2001-343205 | 12/2001 |

* cited by examiner

INTERCONNECTION PATTERN INSPECTION METHOD, MANUFACTURING METHOD OF SEMICONDUCTOR DEVICE AND INSPECTION APPARATUS

CROSS REFERENCE TO RELATED APPLICATION

This is a division of application Ser No. 10/754,609, filed Jan. 12, 2004, now U.S. Pat. No. 7,047,154, which is incorporated herein by reference.

This application claims benefit of priority under 35 USC §119 to Japanese Patent Application No. 2003-5883, filed on Jan. 14, 2003, the contents of which are incorporated by reference herein.

BACKGROUND OF THE INVENTION

1. Field of the Invention

The present invention relates to a method of inspecting whether an interconnection pattern groove formed on a surface of a substrate is successfully filled with a metal, and a manufacturing method of a semiconductor device using this inspection method and an inspection apparatus. More specifically, the present invention relates to, for example, an inspection of a degree to which a fine interconnection pattern groove with a high aspect ratio is filled with a metal in a manufacturing process of an LSI (Large Scale Integrated Circuit) or a VLSI (very large scale integrated circuit) semiconductor devices.

2. Related Background Art

Hereinafter, in a process of inspecting whether an interconnection pattern groove is successfully filled with a metal, an actual interconnection pattern cannot be directly measured because of the minuteness of the actual interconnection pattern, difficulty in a non-contact type measurement of metal film thickness and so forth. Therefore, there has been used a method in which a pattern for measurement is produced in a wafer and measuring this pattern to perform an indirect inspection. Such indirect inspection methods include a contact method of measuring a sheet resistance of a pattern for measurement by using a four-point probe method (e.g., Japanese Patent No. 2559512), a method of managing a film thickness by observing a pattern for measurement by using an optical microscope (e.g., Japanese Patent No. 2570130), a method of inspecting a filling degree of a through hole on the basis of a change in a layer resistance by using the four-point probe method or an eddy current method (e.g., Japanese Patent Laid Open (kokai) 10-154737) and others.

Since the method disclosed in Japanese Patent No. 2559512 is a contact method, it has a problem that an actual interconnection pattern cannot be directly measured. In addition, the method disclosed in Japanese Patent No. 2570130 has a problem that automation and quantification are difficult because of the measurement using an optical microscope.

Further, the method disclosed in Japanese Patent Laid Open (kokai) 10-154737 uses a principle that a void generated in a metal interconnection would contribute as a resistance to a flow of a current when a void is. It measures a filling degree of a via on the basis of a change in a layer resistance, which increases in a defective product with a void produced therein and, on the other hand, decreases the layer resistance in a non-defective product having no void.

However, with acceleration of minuteness in recent years, there have increased fine patterns such as a pattern with a high aspect ratio and a small through hole diameter, a line with a very thin width and others. When trying to measure a change in a layer resistance in such a pattern, it is hard to detect a change in the layer resistance since a current rarely flows through this fine pattern. Furthermore, in common with the methods mentioned above, there is a problem that an area in which a pattern for measurement is produced must be assigned on a wafer.

In order to solve above problems, there has been recently developed a method of directly inspecting an interconnection pattern. Examples of such direct inspection methods include a destructive inspection method in which a wafer is split off at a desired observation position and observed by using an electron microscope, a non-destructive inspection method in which a wafer having a bias voltage applied thereto is irradiated with electron beams and an inspection is carried out by obtaining a voltage contrast based on a phenomenon that the emission quantity of secondary electrons varies depending on a conductivity (change in resistance) of a material embedded as an interconnection (e.g., Japanese Patent Laid Open (kokai) 2001-313322), and others.

However, the method disclosed in Japanese Patent Laid Open (kokai) 10-154737 has a problem that considerable amounts of time and cost are consumed since a plurality of steps are required before the measurement, as well as a restriction that this method cannot be used in a product wafer because of the destructive inspection.

Moreover, although the method disclosed in Japanese Patent Laid Open (kokai) 2001-313322 is expected as a method which can inspect a filling degree of an interconnection pattern groove in a product wafer in the non-contact manner, there have been pointed out many problems that a very large and expensive apparatus is required as an inspection apparatus since a complicated structure including a vacuum system is necessary, a throughput is slow, the inspection cannot be stably performed and the like.

BRIEF SUMMARY OF THE INVENTION

According to a first aspect of the invention, there is provided a method of inspecting an interconnection pattern formed by depositing a metal onto a substrate having an interconnection pattern groove formed on a surface thereof, comprising:

selectively measuring a thickness of a part above the substrate of a metal film formed on the substrate, the part above the substrate being a part constituted of the metal deposited upward from substantially the same surface as the surface of the substrate on which an interconnection pattern groove is formed; and evaluating how successfully the interconnection pattern groove is filled with the metal on the basis of a film thickness value obtained by the selective measurement.

According to a second aspect of the invention, there is provided a manufacturing method of a semiconductor device comprising a method of inspecting an interconnection pattern formed by depositing a metal onto a substrate having an, interconnection pattern groove formed on a surface thereof, the method of inspecting an interconnection pattern comprising:

selectively measuring a thickness of a part above the substrate of a metal film formed on the substrate, the part above the substrate being a part constituted of the metal deposited upward from substantially the same surface as the surface of the substrate on which an interconnection pattern groove is formed; and evaluating how successfully the interconnection pattern groove is filled with the metal on the basis of a film thickness value obtained by the selective measurement.

According to a third aspect of the invention, there is provided an apparatus to inspect an interconnection pattern, formed by a metal deposited onto a substrate having an interconnection pattern groove formed on a surface thereof, comprising:

a film thicknessmeter which selectively measures a film thickness of a part above the substrate of the metal film formed on the substrate, the part above the substrate being a part constituted of the metal deposited upward from substantially the same surface with the surface of the substrate on which the interconnection pattern groove is formed; and an evaluator which evaluates how successfully the interconnection pattern groove is filled with the metal on the basis of a film thickness value obtained by the film thicknessmeter.

DETAILED DESCRIPTION OF THE INVENTION

First of all, an inspection principle on which embodiments of interconnection pattern inspection methods according to the present invention is based will be briefly described below with reference to FIGS. 1 to 5.

FIGS. 1 to 5 are schematic cross-sectional views illustrating specific steps of forming metal interconnections on a surface of a wafer.

Figure 1:
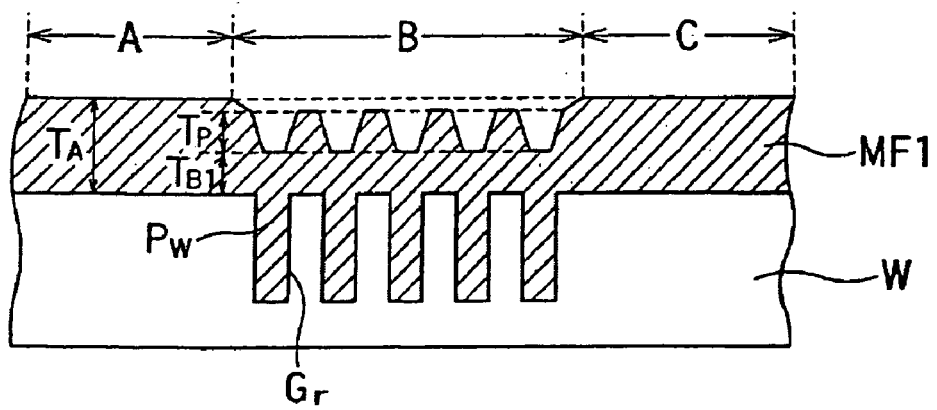
FIGS. 1 to 5 are schematic cross-sectional views of wafers illustrating an inspection principle on which an interconnection pattern inspection method according to the present invention is based.
Figure 2:
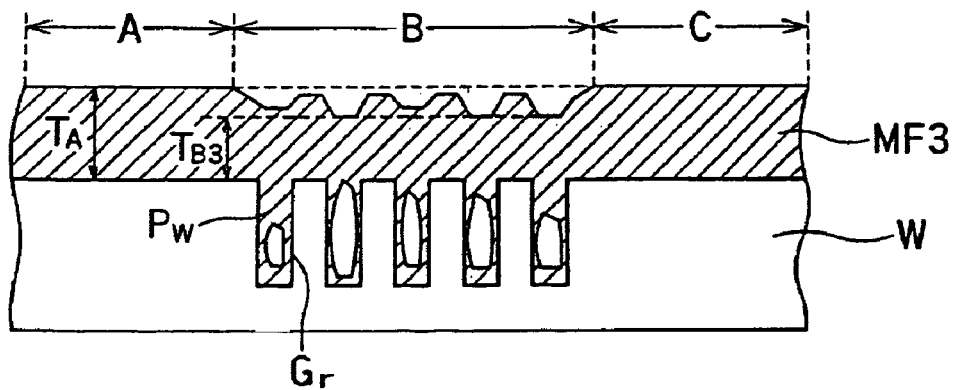
Figure 3:
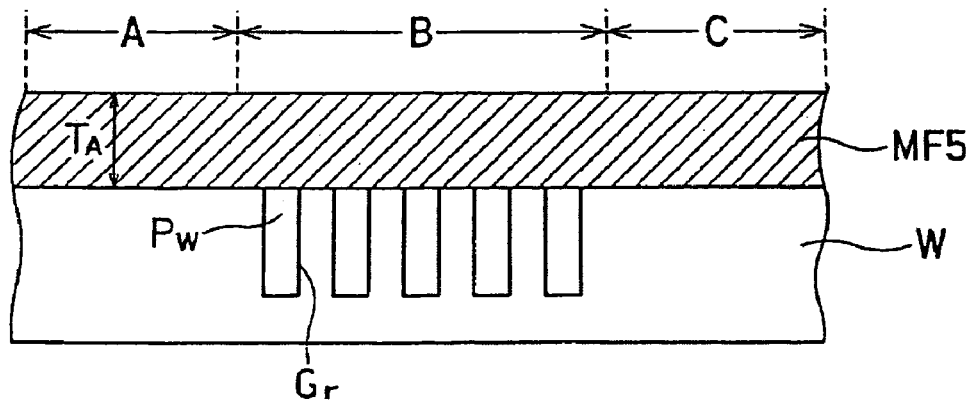
Figure 4:
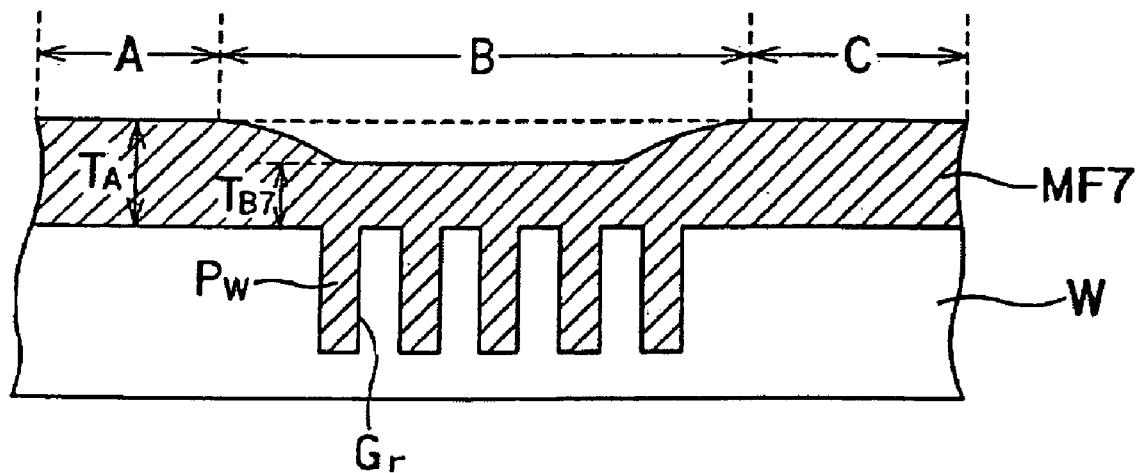
Figure 5:
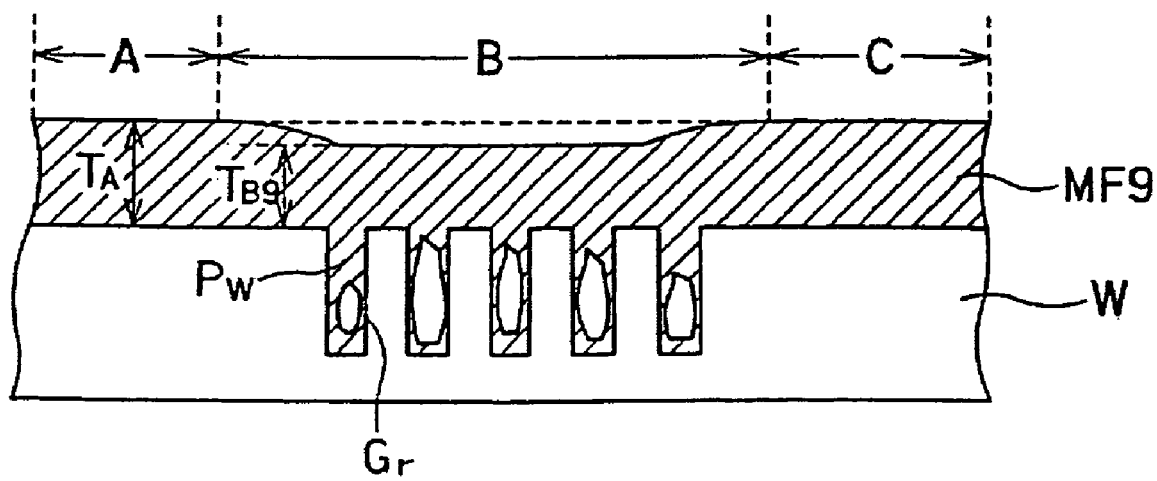

In these cross-sectional views, grooves Gr for a line pattern or via which are used to form interconnections are previously formed on an upper surface of a wafer W by etching processing. By performing a sputtering method, a plating method, a CVD (Chemical Vapor Deposition) method or the like onto the wafer W, a metal film MF is formed in such a manner that the interconnection pattern grooves Gr is filled with a metal material and the metal material still extends onto their peripheral areas. As a result, interconnections are formed in the interconnection pattern groove Gr. FIG. 1 and FIG. 4 show examples of non-defective products in which the interconnection pattern grooves Gr are successfully filled with a metal. On the other hand, FIG. 2, FIG. 3 and FIG. 5 show examples of defective products in which filling with the metal is not sufficiently carried out. It is to be noted that a difference in film shape between FIGS. 1 and 4 or a difference in film shape between FIGS. 2 and 5 depends on a type or a shape (aspect ratio, size) of each interconnection pattern Pw, a pattern density, a film formation method and the like.

In FIGS. 1 to 5, an area B is an area where the grooves Gr for the interconnection patterns Pw are formed in the uppermost layer of the wafer W, and interconnection pattern grooves Gr are filled with the metal material in the area B by forming the metal film MF on the wafer W, thereby forming the interconnection patterns Pw. Areas A and C are areas where the interconnection pattern grooves Gr are not formed in the uppermost layer.

When the interconnection pattern grooves Gr are normally filled with the metal, e.g., as shown in FIG. 1, large irregularities appear on a surface of the metal film MF1 in the area B. In FIG. 1 a film thickness in the area B from the same surface as the upper face of the wafer W, i.e., the upper face of the interconnection patterns Pw, if the interconnection patterns Pw are perfect interconnections, to the bottom surfaces of the concave portions of the metal film MF1 is referred to TB1. The film thickness TB1 in the area B is thinner than a film thickness TA of the metal film MF in the areas A and C. Additionally, e.g., as shown in FIG. 4, a film thickness TB7 from the same surface as the upper face of the wafer W to the top surface of the metal film MF7 in the area B is thinner than the film thickness TA in the areas A and C.

On the contrary, when filling with the metal is not normally carried out, a difference between a film thickness of the metal film at a part deposited upward from the same surface as the upper face of the wafer W in the area B and a film thickness of the metal film in the other areas A and C becomes smaller as a degree of filling defect increases.

For example, when a filling defect occurs in a film shape shown in FIG. 1, since steps of irregularities on the metal film surface in the area B become smaller as shown in FIG. 2, a film thickness TB3 from the same surface as the upper face of the wafer W to the bottom surfaces of the concave portions of the metal film MF3 in the area B is thicker than the film thickness TB1 shown in FIG. 1. Further, for example, when a filling defect occurs in a film shape shown in FIG. 4, a film thickness TB7 from the same surface as the upper face of the wafer W to the surface of the metal film MF7 becomes thicker like a film thickness TB9 of a metal film MF9 shown in FIG. 5 simply in proportion to the degree of the filling defect. Furthermore, for example, when the interconnection pattern grooves Gr are not filled with the metal at all in the film shape shown in FIG. 1, a difference in film thickness between the areas A, B and C becomes zero as represented by a metal film MF5 in FIG. 3.

Therefore, information of the filling degree of the interconnection pattern grooves Gr with the metal material can be acquired by monitoring a change in film thickness in the part of the metal film MF deposited upward from the same surface as the top face of the wafer W in the area B, where the interconnection patterns Pw are formed, other than the interconnection pattern groove inner portions. Here, as the density of the interconnection pattern grooves Gr is higher, a cubic content of the metal which fills the interconnection pattern grooves Gr (in the area B) and is still deposited upward from the same surface as the top face of the wafer W is more substantially reduced, and a difference between the film thickness TA and the film thickness TB becomes larger. Therefore, by performing the measurement in the area with the high density of the interconnection pattern grooves Gr, the film thicknesses TA and TB and a change can be more prominently measured in accordance with a filling degree of the interconnection pattern grooves Gr with the metal material as compared with the measurement in the area with the low density of the interconnection pattern grooves Gr, thereby improving a measurement accuracy. Typical measurement methods for such an inspection include a four-point probe type for a contact mode, an optical type, an optical acoustic type, an X-ray type and an eddy current type for a non-contact mode. However, the measurement can be performed by using a metal film thicknessmeter which is of an arbitrary measurement type.

Some embodiments according to the present invention will now be described hereinafter with reference to FIGS. 6 to 13. In the following embodiments, a description will be given as to the case that an eddy current type film thicknessmeter is taken as an example of the film thicknessmeter.

Figure 6:
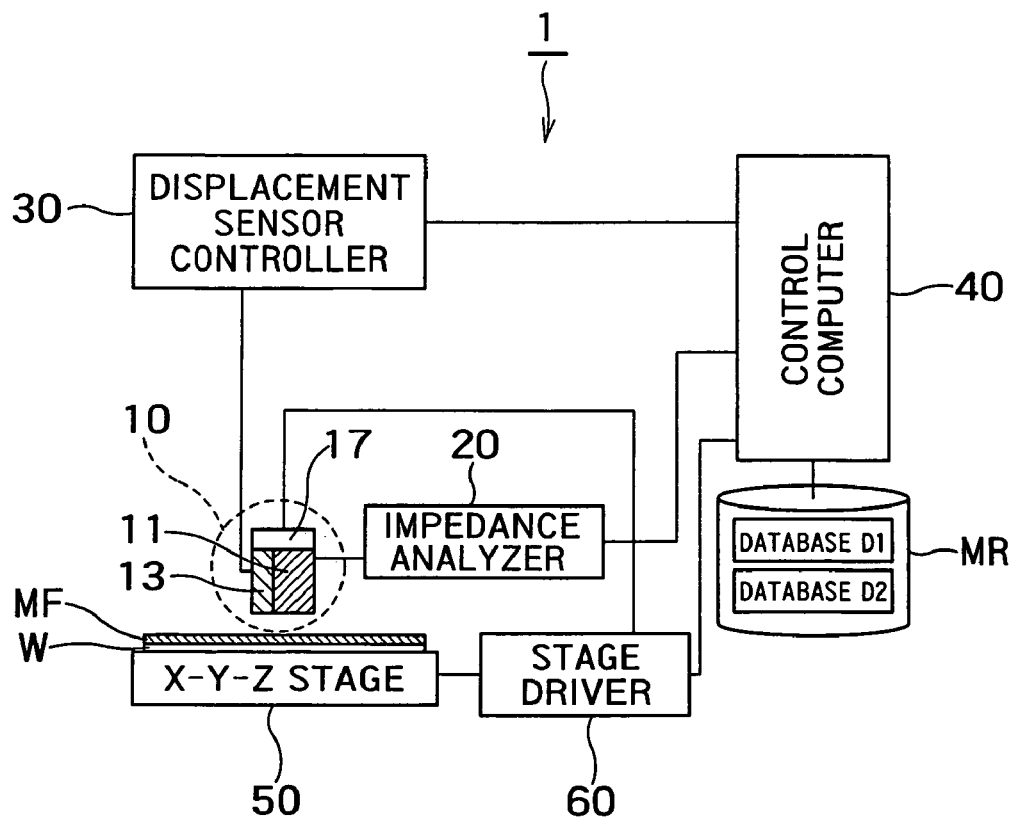
FIG. 6 is a block diagram schematically showing an embodiment of the inspection apparatus according to the present invention.

FIG. 6 is a block diagram schematically showing an embodiment of an inspection apparatus according to the present invention. An inspection apparatus 1 shown in this drawing comprises an eddy current loss measurement sensor unit 10, an impedance analyzer 20, a displacement sensor controller 30, a control computer 40, a memory MR, an X-Y-Z stage 50, and a stage driver 60. The eddy current loss measurement sensor unit 10 includes an eddy current loss measurement sensor 11, a capacitance type displacement sensor 13, and a Z stage 17. The memory MR is connected to the control computer 40, and stores databases D1 and D2 which will be described later. The impedance analyzer 20, the displacement sensor controller 30 and the stage driver 60 are connected to the control computer 40, and respectively receive command signals from the control computer 40. The X-Y-Z stage 50 supports a wafer W on an upper face thereof, is connected to the stage driver 60 to thereby receive a drive signal, and moves the wafer W in three directions of X, Y and Z without restraint. The Z stage 17 is also connected to the stage driver 60 and receives a drive signal to move the eddy current loss measurement sensor unit 10 in the direction Z. The capacitance type displacement sensor 13 of the eddy current loss measurement sensor unit 10 is connected to the displacement sensor controller 30, and the displacement sensor controller 30 measures a change in capacitance between a capacitance type displacement sensor electrode 13 EL (see FIG. 7B) and a metal film MF and transmits a measurement result to the control computer 40.

Figure 7A:
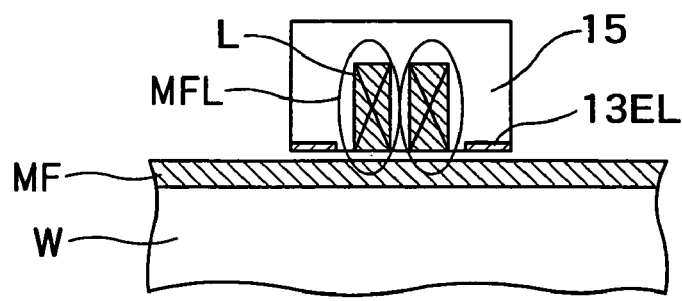
FIG. 7A is a cross-sectional view showing a detailed structure of an eddy current loss measurement sensor unit incorporated in the inspection apparatus depicted in FIG. 6.
Figure 7B:
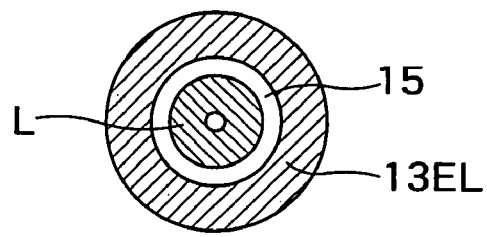
FIG. 7B is a bottom view of the eddy current loss measurement sensor unit in the inspection apparatus depicted in FIG. 6.

FIGS. 7A and 7B are explanatory views showing the eddy current loss measurement sensor unit 10 in more detail. FIG. 7A shows a partial front view of the eddy current loss measurement sensor unit 10 together with a partial cross-sectional view of the wafer W having the metal film MF formed on the upper face thereof. FIG. 7B shows a bottom view of the eddy current loss measurement sensor unit 10.

The eddy current loss measurement sensor 11 has an excitation-reception integrated coil L, is connected to the impedance analyzer 20, and receives a supply of a high-frequency current from the impedance analyzer 20 to excite a high-frequency magnetic field by using the coil L. The eddy current loss measurement sensor 11 is configured in such a manner that a line of magnetic flux MFL (see FIG. 7A) of a magnetic field to be excited locally passes through a surface layer of the metal film MF when this sensor is positioned above the metal film MF of the wafer W. An eddy current is excited in the metal film MF by this magnetic field, and there is generated an eddy current loss P which is in proportion to a square of a frequency f of the high-frequency current and a film thickness t of the metal film MF and in inverse proportion to a resistivity ρ of the metal film MF as represented by the following expression.

$$P \propto (f^2 \cdot t)/\rho$$

When the current loss P is generated in the metal film MF, the eddy current loss measurement sensor 11 receives a resultant magnetic field of a magnetic field generated from the eddy current and a magnetic field excited by the coil L. Consequently, an impedance of the eddy current loss measurement sensor 11 and a current value or a phase of the high-frequency current supplied from the impedance analyzer 20 to the coil L of the eddy current loss measurement sensor 11 are changed in accordance with the film thicknesses TA and TB of the metal film MF. The impedance analyzer 20 measures this change, and transmits a measurement result to the control computer 40.

As shown in FIG. 7B, the capacitance type displacement sensor 13 has a sensor electrode 13 EL provided so as to be wound around the bottom portion of the coil L of the eddy current loss measurement sensor 11 via an insulating material 15 formed so as to cover the excitation-reception integrated coil L. The sensor electrode 13 EL is connected to the displacement sensor controller 30, and the displacement sensor controller 30 is connected to the ground via an interconnection (not shown). The metal film MF is also connected to the ground through an interconnection (not shown). As a result, the capacitance type displacement sensor electrode 13 EL and the electroconductive film MF constitute electrodes on both sides of a capacitor. As shown in FIG. 7A, in this embodiment, the sensor electrode 13 EL is arranged in such a manner that its bottom face and a bottom face of the eddy current loss measurement sensor 11 are positioned on the same plane, and a capacitance between the capacitance type displacement sensor electrode 13 EL and the metal film MF is thereby changed in accordance with a displacement between the eddy current loss measurement sensor unit 10 and the metal film MF. The displacement sensor controller 30 detects this change in capacitance, and transmits its result to the control computer 40. The capacitance type displacement sensor 13 can measure a capacitance over an area sufficiently wider than an interconnection pattern formation area B, and a displacement measurement result is integrated in a plane of the sensor electrode 13 EL. Therefore, the affect of irregularities on the interconnection pattern surface can be suppressed to the very low level.

Again referring to FIG. 6, the control computer 40 effects the impedance analyzer 20 to supply a high-frequency current to the eddy current loss measurement sensor 11, and operates the X-Y-Z stage 50 or the X-Y-Z stage 50 and the Z stage 17 through the stage driver 60 while measuring a displacement between the eddy current loss measurement sensor 11 and the metal film MF by using the capacitance type displacement sensor 13 through the displacement sensor controller 30, thereby scanning a surface area of the wafer W. During this scanning, the control computer 40 receives a measurement result of the eddy current loss measurement sensor 11 from the impedance analyzer 20 and, at the same time, calculates a film thickness of the metal film MF by making reference to the databases D1 and D2 stored in the memory MR.

A method of controlling the X-Y-Z stage 50 and the Z stage 17 utilizing a measurement result of the capacitance type displacement sensor 13 includes a method of measuring an eddy current loss while maintaining a distance between the metal film MF on the wafer W and the eddy current loss measurement sensor 11 constant, and a method of executing correction processing with respect to an eddy current loss measured value obtained from the eddy current loss measurement sensor 11 by using a measurement result of a displacement between the eddy current loss measurement sensor 11 and the metal film MF without operating the Z stage 17.

A resistance is high in a portion of the metal film constituted by parts of small cubic contents like the portion of the interconnection pattern. Pw or the portion with irregular surface in the area B above the interconnection pattern Pw (see, e.g., FIG. 1). In principle, the eddy current has characteristics that it has difficulty in flowing through an area with such a high resistance. As a result, a film thickness TB at a part constituted of the metal deposited upward from the same surface as the surface (surface on which the metal film MF is formed) of the wafer W (which will be simply referred to as a part above the substrate hereinafter) and a film thickness (TB+TP) are selectively measured rather than a thickness of the metal deposited within the interconnection pattern Pw. Further, in the film thickness measurement based on the eddy current loss like this embodiment, a relatively wide area is collectively measured, and there can be acquired a measurement result obtained by integrating a film thickness at the part above the substrate in the entire measurement area. Therefore, changes in the film thickness TA and the film thickness TB can be more noticeably measured in accordance with a filling degree of the interconnection pattern grooves Gr with the metal material as more interconnection patterns Pw are formed with a higher density, thereby improving the measurement accuracy.

A description will now be given as to the databases D1 and D2 which are stored in the memory MR and used in a film thickness calculation of the metal film at the part above the substrate.

Figure 8:
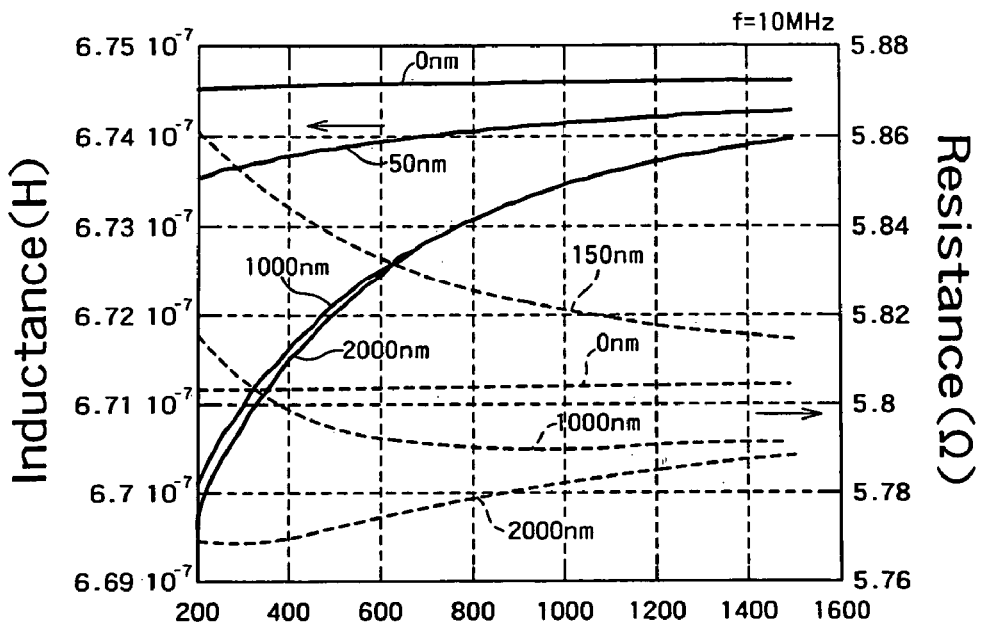
FIG. 8 is a graph showing a part of a data content in a database D1 stored in a memory of the inspection apparatus depicted in FIG. 6.
Figure 9:
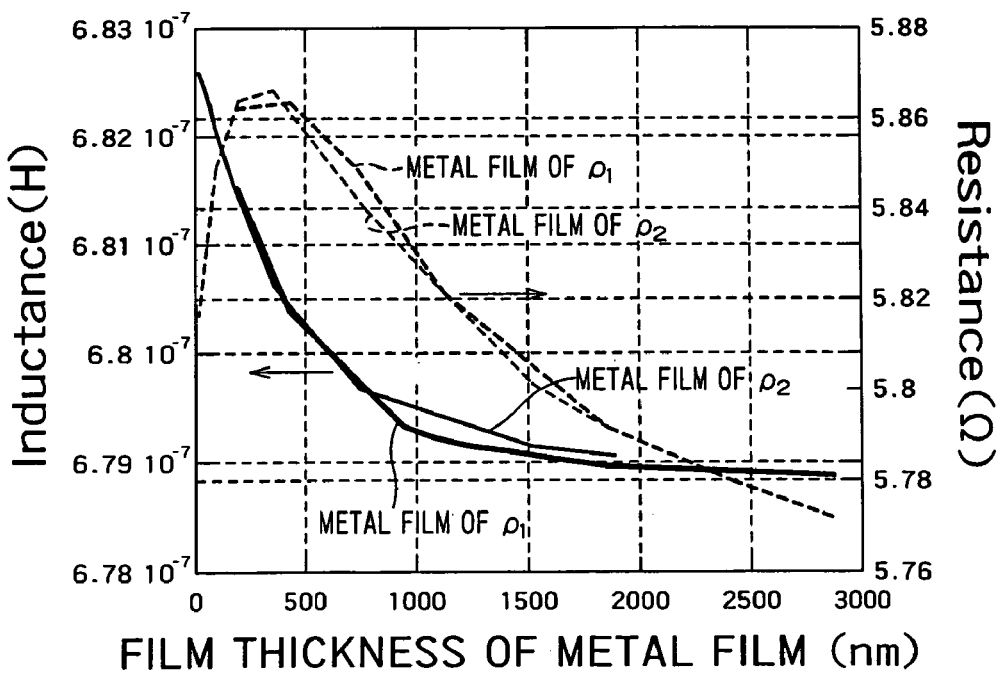
FIG. 9 is a graph showing another part of the data content in the database D1 stored in the memory of the inspection apparatus depicted in FIG. 6.

In the database D1, data representing a relationship between changes in impedance of the eddy current loss measurement sensor 11, changes in a current quantity and a phase of a high-frequency current supplied from the impedance analyzer 20 to the coil L, a film thickness and a resistivity ρ of the metal film at the part above the substrate, and a displacement between the metal film and the eddy current loss measurement sensor is previously measured and prepared. FIGS. 8 and 9 show examples of such data. FIG. 8 shows an example of a graph in which changes in an inductance and a resistivity of the eddy current loss measurement sensor 11 relative to a displacement between the eddy current loss measurement sensor 11 and the metal film MF are plotted with a film thickness of the metal film MF at the part above the substrate being used as a parameter. Furthermore, FIG. 9 shows an example of a graph in which a relationship between a film thickness of the metal film MF at the part above the substrate and an inductance and a resistivity of the eddy current loss measurement sensor 11 is plotted with a difference in resistivity ρ of the metal film MF being used as a parameter. The control computer 40 converts a measurement result of the eddy current loss measurement sensor 11 supplied from the impedance analyzer 20 into a film thickness of the metal film MF at the part above the substrate by making reference to such a database D1.

Figure 10:
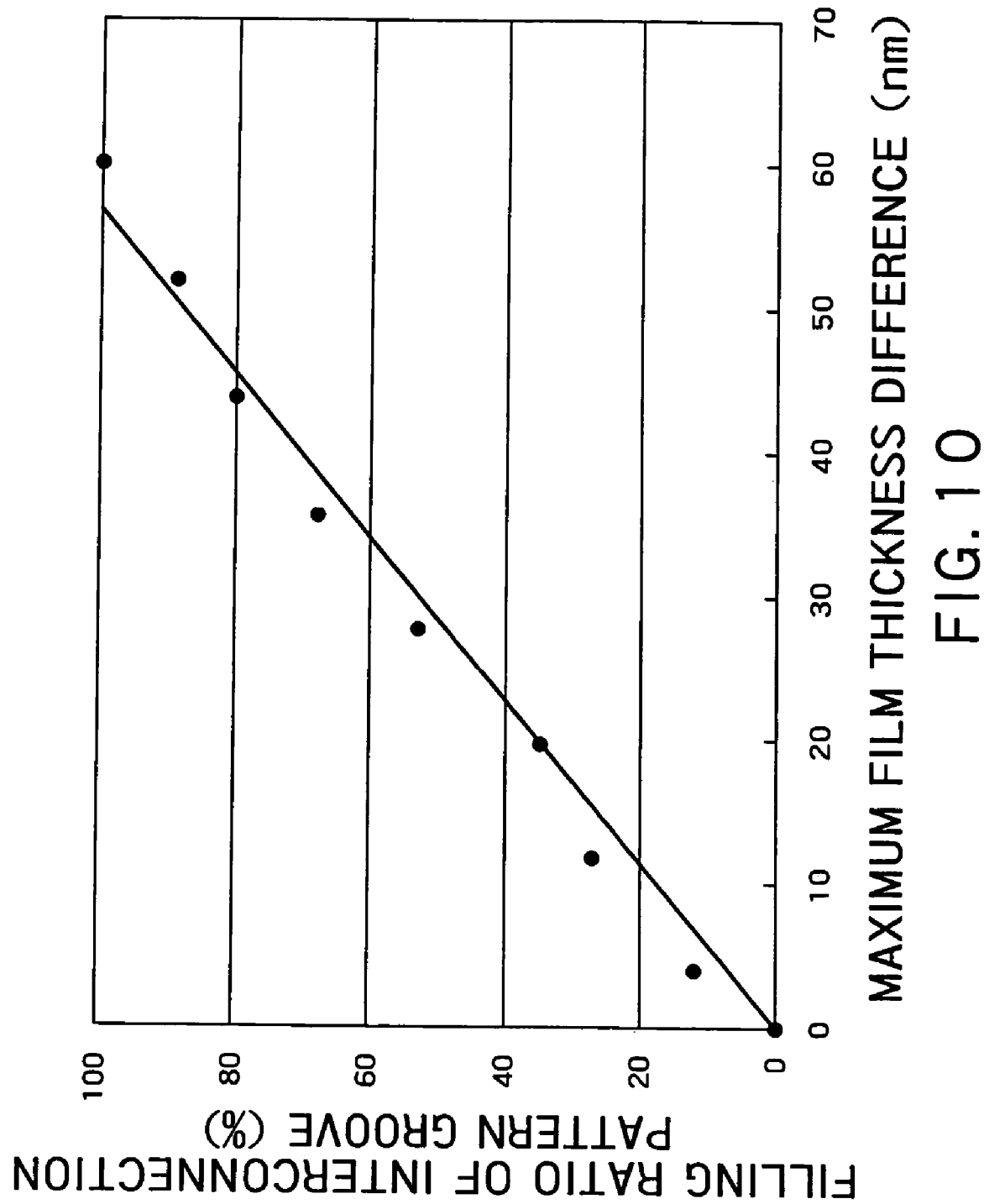
FIG. 10 is a graph showing a part of a data content of a database D2 stored in a memory of the inspection apparatus depicted in FIG. 6.

In the database D2, data representing a relationship between a film thickness of the metal film MF at the part above the substrate and a filling ratio of the interconnection pattern grooves Gr is previously measured and prepared. FIG. 10 shows an example of such data. This drawing is a graph in which a correlation between a maximum film thickness difference of the metal film MF at the part above the substrate and a filling ratio of the interconnection pattern grooves Gr is plotted. The control computer 40 calculates a film thickness difference between the areas A and C where the interconnection pattern grooves Gr are not formed and the area B where the interconnection pattern grooves Gr are formed from film thickness values of the metal film MF at the part above the substrate obtained by scanning the wafer W, calculates a filling ratio of the interconnection grooves Gr with the metal by making reference to the database D2, and outputs a result.

A first embodiment of an interconnection pattern inspection method using the inspection apparatus 1 depicted in FIG. 6 will now be described with reference to a flowchart of FIG. 11.

First, a frequency of a high-frequency current supplied from the impedance analyzer 20 to the eddy current loss measurement sensor 11 is set to a value optimum for a target film thickness with reference to the target film thickness aimed in forming the metal film MF of the wafer W (step S1). A range of a variable frequency is, e.g., 1 MHz to 10 MHz.

Then, the X-Y-Z stage 50 or both the X-Y-Z stage 50 and the Z stage 17 are driven while a high-frequency magnetic field is excited by a high-frequency current supplied from the impedance analyzer 20 to the eddy current loss measurement sensor 11 at the set frequency. As a result, the eddy current loss measurement sensor 11 is used to scan the metal film MF from the area A where the interconnection pattern grooves Gr are not formed to the area C where the interconnection pattern grooves Gr are not formed through the area B where the interconnection pattern grooves Gr are formed, thereby measuring film thicknesses of the metal film MF at the part above the substrate (step S2).

Figure 12:
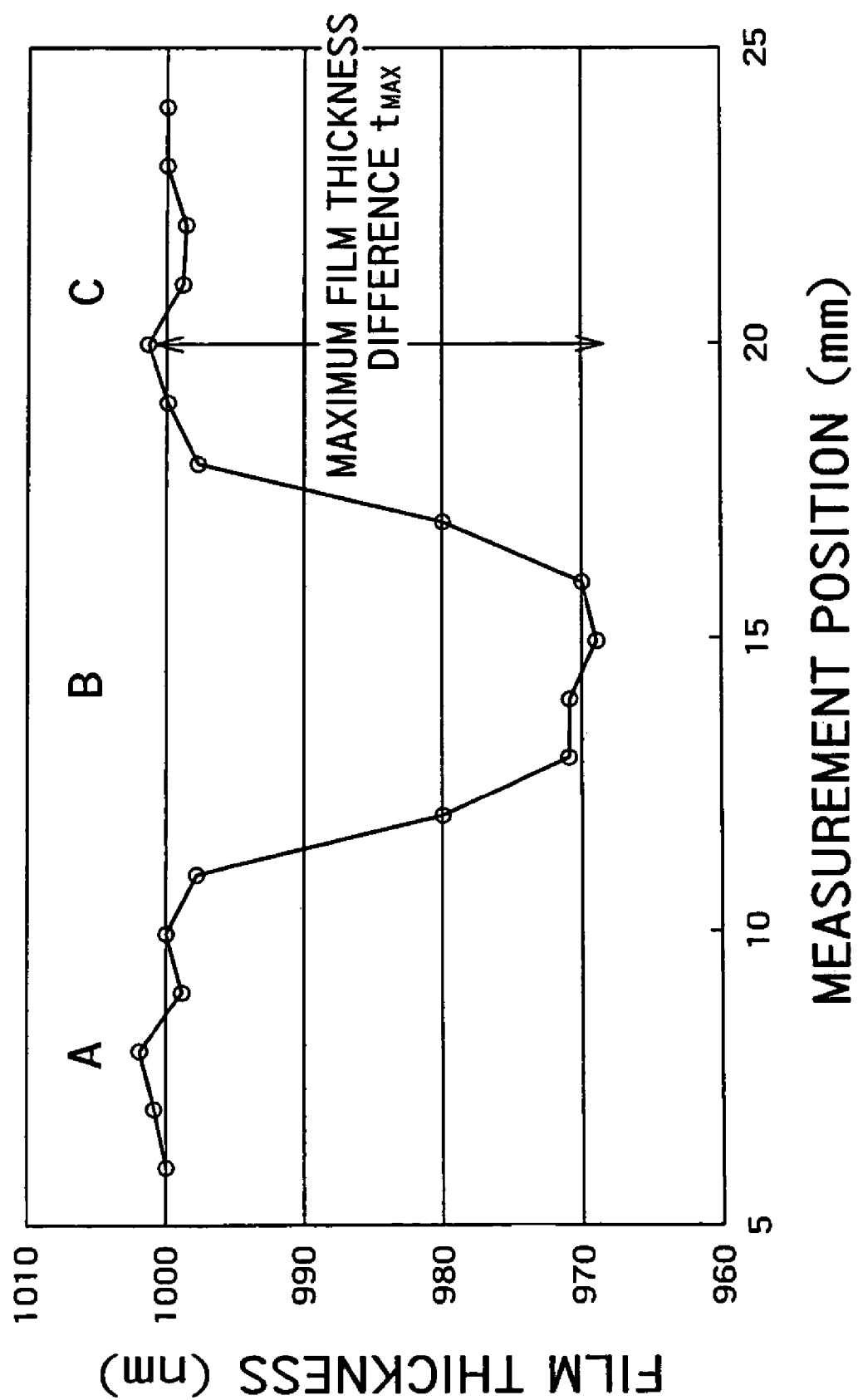
FIG. 12 shows a result of measuring a film thickness by scanning an area A to an area C depicted in FIG. 2 by using an eddy current loss measurement sensor.

Subsequently, the maximum value of a film thickness difference in the areas scanned by the eddy current loss measurement sensor 11 is calculated from the film thickness measurement result (step S3). FIG. 12 shows a measurement result obtained by scanning the metal film MF from the area A to the area C depicted in FIG. 2 as an example of such a film thickness measurement result.

Figure 11:
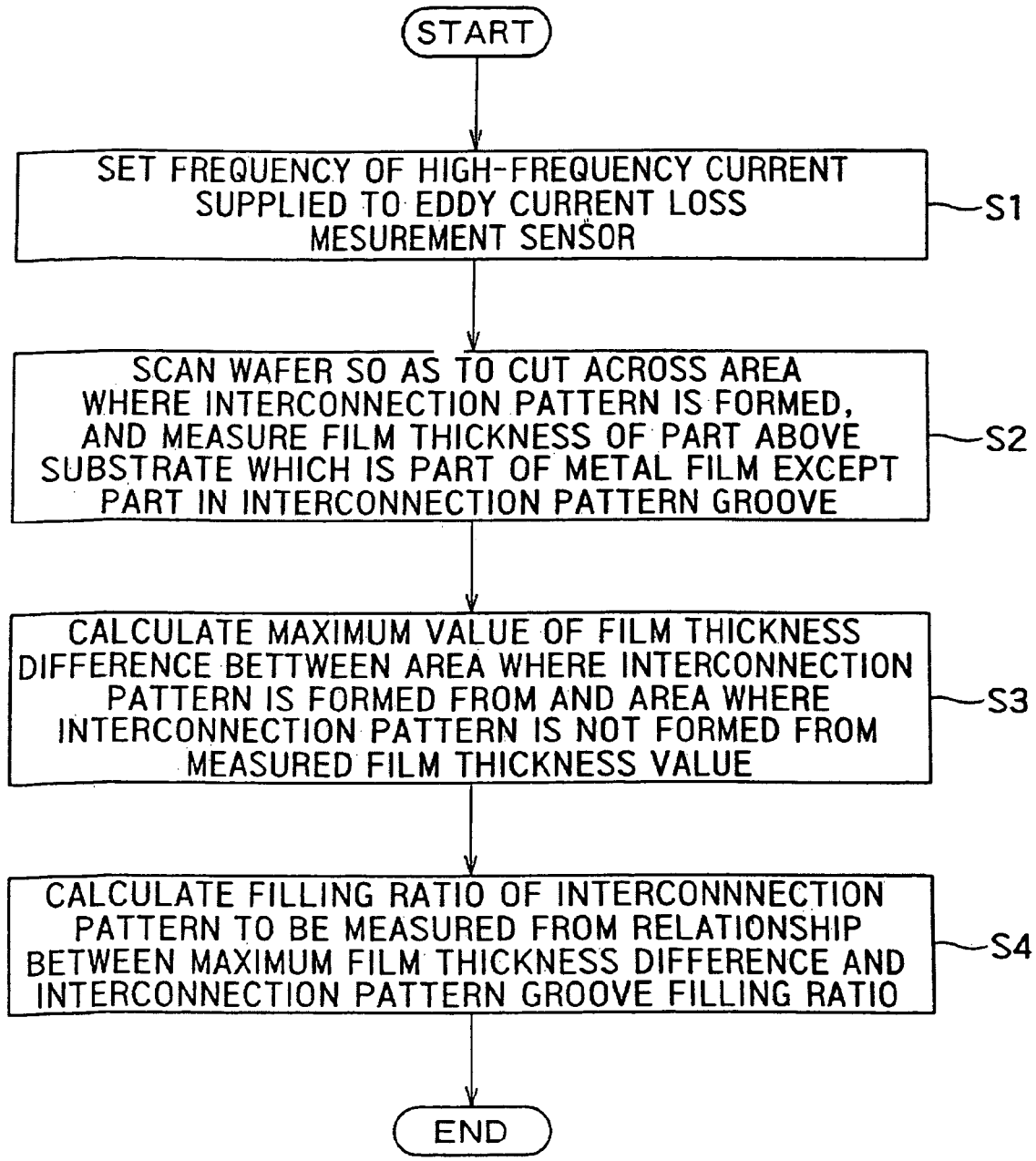
FIG. 11 is a flowchart showing a schematic procedure of a first embodiment of an interconnection pattern inspection method according to the present invention.

At last, a filling ratio of the interconnection pattern grooves Gr with the metal is calculated with respect to the interconnection pattern Pw to be measured on the basis of a correlation between the maximum film thickness difference of the metal film at the part above the substrate and the filling ratio of the interconnection pattern grooves which is stored in the memory MR as the database D2 (see FIG. 6), and an obtained result is outputted (FIG. 11, a step S4).

Here, for example, a value of 80% in FIG. 10 can be set as a threshold value to be used to judge the quality of a product, and a product can be judged as a non-defective one when a calculated filling ratio exceeds 80%.

Figure 13:
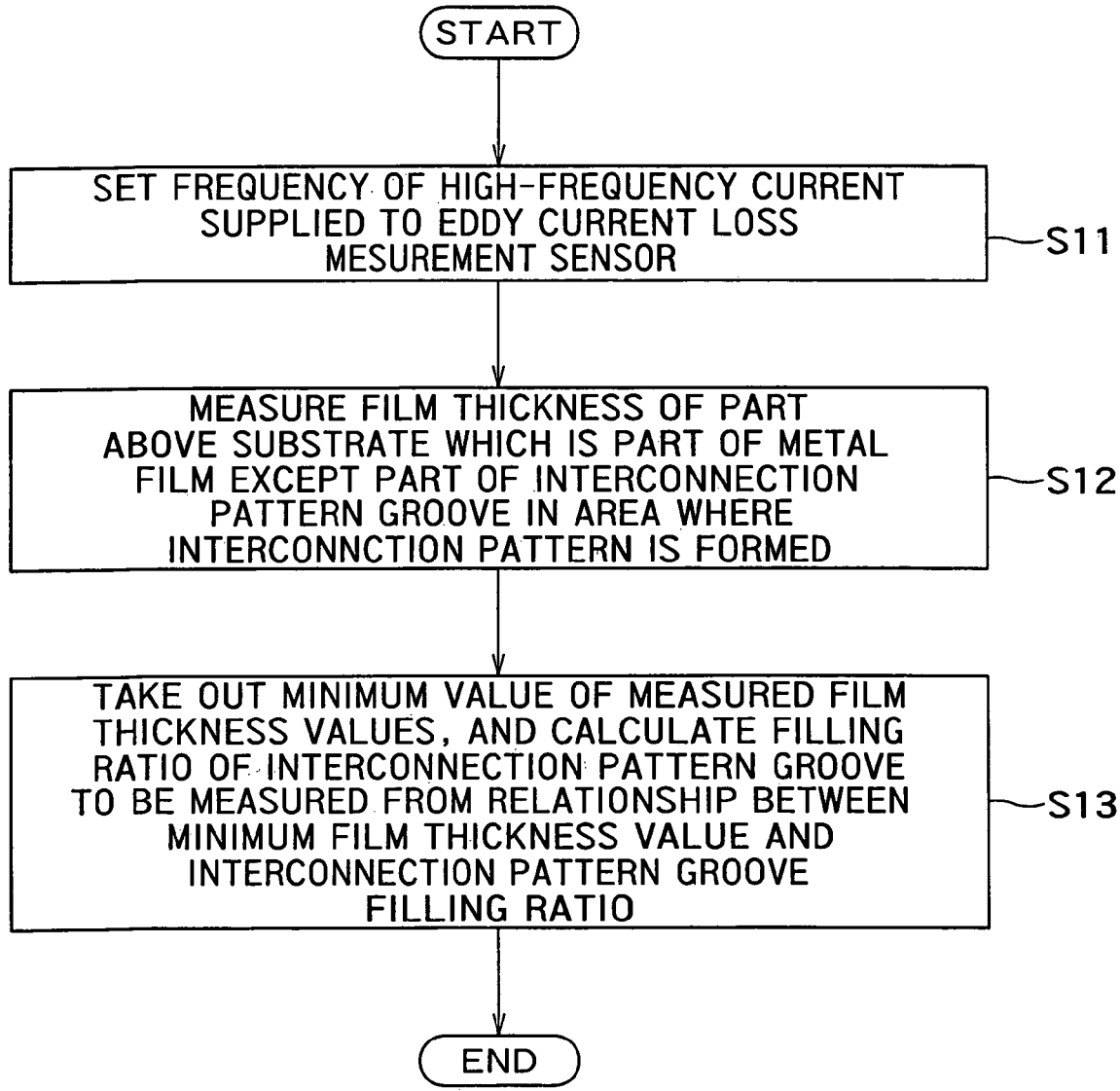
FIG. 13 is a flowchart showing a schematic procedure of a second embodiment of the interconnection pattern inspection method according to the present invention.

FIG. 13 is a flowchart showing a schematic procedure of a second embodiment of an interconnection pattern inspection method using the inspection apparatus 1. In this embodiment, as the database D2 stored in the memory MR, there is previously prepared a relationship (not shown) between a minimum film thickness value of the metal film MF at the part above the substrate measured in the area B of a non-defective product having the interconnection pattern grooves Gr sufficiently filled with the metal and a filling ratio of the interconnection pattern grooves Gr.

First, like the first embodiment, a frequency of a high-frequency current to be supplied to the eddy current loss measurement sensor 11 is set to a value optimum for a target film thickness of the metal film MF (step. S11). Then, only the area B where the interconnection pattern grooves Gr are formed is scanned without scanning the areas A and C where the interconnection pattern grooves Gr are not formed and only film thicknesses of the part above the substrate of the metal film. MF are measured (step S12). At last, a minimum film thickness value is taken out from the obtained film thickness values, and a filling ratio of the interconnection grooves Gr with the metal is calculated with respect to the interconnection patterns Pw to be measured from the minimum film thickness value in the area B with reference to the relationship (not shown) between the minimum film thickness value and the filling ratio in the interconnection pattern grooves Gr prepared as the database D2 (step S13).

By measuring exclusively the film thicknesses of the metal film MF at the part above the substrate in the area B where the interconnection pattern grooves Gr are formed, the filling ratio of the interconnection pattern grooves Gr with the metal can thus be calculated.

According to the above-described embodiments, it is possible to readily evaluate a filling degree with the metal in the very fine interconnection pattern grooves with a high aspect ratio which is hard to be measured in the prior art. Moreover, since a product wafer can be directly measured in the non-contact manner, the inspection steps can be substantially simplified.

Additionally, according to the foregoing embodiments, since the eddy current mode is adopted, a high-speed measurement is possible with the simple and small measurement system, and the non-contact type in-line and in-situ measurement and inspection can be performed in the film formation device.

Further, a semiconductor device can be manufactured with a high yield ratio and a high throughput by producing the semiconductor device utilizing the above-described inspection methods.

Although some of the embodiments according to the present invention have been described, the present invention is not restricted thereto, and it can be modified and carried out within the scope thereof. Although the description has been given as to the case that a product pattern is directly measured in the inspection method mentioned above, this method can be also used in measurement of an inspection pattern.

Furthermore, although the apparatus including the single eddy current loss measurement sensor 11 is taken as an example in the description of the embodiment of the inspection apparatus, the throughput can be further improved by arranging a plurality of eddy current loss measurement sensors 11 in the measurement apparatus, or a plurality of chips on the wafer surface can be simultaneously measured and inspected.

Moreover, the in-line and in-situ measurement in vacuum is enabled by incorporating the above-described inspection apparatus in a film formation system. In order to perform the in-situ measurement during film formation, arranging the eddy current loss measurement sensor 11 on a rear surface side of the wafer W can suffice.

Additionally, although the eddy current mode has been described in detail in the foregoing embodiments, a filling degree of the pattern can be readily measured like the eddy current mode by using the above-described measurement method and measurement algorithm even if a metal film thickness measurement apparatus adopting any other mode is utilized.

What is claimed is:

1. A method of inspecting an interconnection pattern formed by depositing a metal onto a substrate having an interconnection pattern groove formed on a surface thereof, comprising:

selectively measuring a thickness of a first part of a metal film above the substrate in a non-contact and non-destructive manner, the metal film being formed on the substrate and having the first part and a second part, the first part of the metal film constituted of the metal deposited upward from substantially the same surface as the surface of the substrate on which an interconnection pattern groove is formed, the second part of the metal film being constituted of the metal deposited within the interconnection pattern groove;

previously preparing a relationship between a film thickness value of the first part and a filling ratio in the interconnection pattern groove; and evaluating, by an evaluator, how successfully the interconnection pattern groove is filled with the metal on the basis of a film thickness value obtained by the selective measurement and the relationship between the film thickness value of the first part and the filling ratio in the interconnection pattern groove, without measurement of a thickness of the second part of the metal film.

2. The method of inspecting an interconnection pattern according to claim 1, wherein the thickness of the first part of the metal film is calculated based on a value of an eddy current loss obtained by exciting an eddy current on a surface of the metal film and measuring an eddy current loss generated by this excitation.

3. The method of inspecting an interconnection pattern according to claim 2, wherein the eddy current is excited by using an eddy current loss measurement sensor which receives a high-frequency current to excite a high-frequency magnetic field, and a frequency of the high-frequency current is set in accordance with a target film thickness during formation of the metal film.

4. The method of inspecting an interconnection pattern according to claim 1, wherein the evaluation of how successfully the interconnection pattern groove is filled with the metal is executed concurrently with formation of the interconnection pattern.

5. A manufacturing method of a semiconductor device comprising a method of inspecting an interconnection pattern formed by depositing a metal onto a substrate having an interconnection pattern groove formed on a surface thereof, said method of inspecting an interconnection pattern comprising:

selectively measuring a thickness of a first part of a metal film above the substrate in a non-contact and non-destructive manner, the metal film being formed on the substrate and having the first part and a second part, the first part of the metal film being constituted of the metal deposited upward from substantially the same surface as the surface of the substrate on which an interconnection pattern groove is formed, the second part of the metal film being constituted of the metal deposited within the interconnection pattern groove;

previously preparing a relationship between a film thickness value of the first part and a filling ratio in the interconnection pattern groove; and evaluating, by an evaluator, how successfully the interconnection pattern groove is filled with the metal on the basis of a film thickness value obtained by the selective measurement and the relationship between the film thickness value of the first part and the filling ratio in the interconnection pattern groove, without measurement of a thickness of the second part of the metal film.

6. The method of manufacturing a semiconductor device according to claim 5, wherein the thickness of the first part of the metal film is calculated based on a value of an eddy current loss obtained by exciting an eddy current on a surface of the metal film and measuring an eddy current loss generated by this excitation.

7. The method of manufacturing a semiconductor device according to claim 6, wherein the eddy current is excited by using an eddy current loss measurement sensor which receives a high-frequency current to excite a high-frequency magnetic field, and a frequency of the high-frequency current is set in accordance with a target film thickness during formation of the metal film.

8. An apparatus to inspect an interconnection pattern formed by a metal deposited onto a substrate having an interconnection pattern groove formed on a surface thereof, comprising:

a film thicknessmeter which selectively measures a thickness of a first part of a metal film above the substrate in a non-contact and non-destructive manner, the metal film being formed on the substrate and having the first part and a second part, the first part of the metal film being constituted of the metal deposited upward from substantially the same surface as the surface of the substrate on which the interconnection pattern groove is formed, the second part of the metal film being constituted of the metal deposited within the interconnection pattern groove; and an evaluator which evaluates how successfully the interconnection pattern groove is filled with the metal on the basis of a film thickness value obtained by the film thicknessmeter and a previously prepared relationship between a film thickness value of the first Part and a filling ratio in the interconnection pattern groove, without measurement of a thickness of the second part of the metal film.

9. The inspection apparatus according to claim 8, wherein the film thicknessmeter includes an eddy current loss measurement sensor which excites an eddy current on a surface of the metal film by exciting a high-frequency magnetic field upon receiving a high-frequency current and measures an eddy current loss generated thereby.

10. The inspection apparatus according to claim 9, wherein a frequency of the high-frequency current is set in accordance with a target film thickness during formation of the metal film.

11. The inspection apparatus according to claim 8, wherein the inspection apparatus is provided in a film formation system which receives the substrate and forms a metal film on the substrate, and evaluates how successfully the interconnection pattern groove is filled with the metal concurrently with formation of the interconnection pattern.

12. A method of inspecting an interconnection pattern formed by depositing a metal onto a substrate having a groove formed on a surface thereof, comprising:

selectively measuring a thickness of a first part of a metal film above the substrate in a non-contact and non-destructive manner, the metal film being formed on the substrate and having the first part and a second part, the first part of the metal film being constituted of the metal deposited upward from substantially the same surface as the surface of the substrate on which a groove is formed, the second part of the metal film being constituted of the metal deposited within the groove, the groove having been formed using etching so as to have a shape of an interconnection pattern;

previously preparing a relationship between a film thickness value of the first part and a filling ratio in the interconnection pattern groove; and evaluating, by an evaluator, how successfully the groove is filled with the metal on the basis of a film thickness value obtained by the selective measurement and the relationship between the film thickness value of the first part and the filling ratio in the interconnection pattern groove, without measurement of a thickness of the second part of the metal film.

13. A manufacturing method of a semiconductor device comprising a method of inspecting an interconnection pattern formed by depositing a metal onto a substrate having an interconnection pattern groove formed on a surface thereof, said method of inspecting an interconnection pattern comprising:

selectively measuring a thickness of a first part of a metal film above the substrate in a non-contact and non-destructive manner, the metal film being formed on the substrate and having the first part and a second part, the first part of the metal film being constituted of the metal deposited upward from substantially the same surface as the surface of the substrate on which a groove is formed, the second part of the metal film being constituted of the metal deposited within the groove, the groove having been formed using etching so as to have a shape of an interconnection pattern;

previously preparing a relationship between a film thickness value of the first part and a filling ratio in the interconnection pattern groove; and evaluating, by an evaluator, how successfully the groove is filled with the metal on the basis of a film thickness value obtained by the selective measurement and the relationship between the film thickness value of the first part and the filling ratio in the interconnection pattern groove, without measurement of a thickness of the second part of the metal film.

14. An apparatus to inspect an interconnection pattern formed by a metal deposited onto a substrate having a groove formed on a surface thereof, comprising:

a film thicknessmeter which selectively measures a film thickness of a first part of the metal film formed on the substrate in a non-contact and non-destructive manner, the metal film being formed on the substrate and having the first part and a second part, the first part above the substrate being constituted of the metal deposited upward from substantially the same surface the surface of the substrate on which a groove is formed, the second part of the metal film being constituted of the metal deposited within the groove, the groove having been formed using etching so as to have a shape of the interconnection pattern; and an evaluator which evaluates how successfully the interconnection pattern groove is filled with the metal on the basis of a film thickness value obtained by the film thicknessmeter and a previously prepared relationship between a film thickness value of the first part and a filling ratio in the interconnection pattern groove, without measurement of a thickness of the second part of the metal film.

* * * * *